United States Patent
Nakamata et al.

(10) Patent No.: US 6,683,512 B2
(45) Date of Patent: Jan. 27, 2004

(54) HIGH FREQUENCY MODULE HAVING A LAMINATE BOARD WITH A PLURALITY OF DIELECTRIC LAYERS

(75) Inventors: Katsurou Nakamata, Kokubu (JP); Shinji Isoyama, Kokubu (JP); Teruyuki Shimura, Tokyo (JP); Toshio Okuda, Tokyo (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 10/172,752

(22) Filed: Jun. 14, 2002

(65) Prior Publication Data

US 2002/0196085 A1 Dec. 26, 2002

(30) Foreign Application Priority Data

Jun. 21, 2001 (JP) .......................... 2001-188331
Jun. 21, 2001 (JP) .......................... 2001-188332

(51) Int. Cl.[7] .............................. H01P 1/213
(52) U.S. Cl. ........................ 333/126; 333/134
(58) Field of Search ................... 333/134, 126, 333/203, 219.1, 202, 204

(56) References Cited

U.S. PATENT DOCUMENTS 5,473,293 A    12/1995  Chigodo et al. ............ 333/104
6,016,090 A  * 1/2000   Iio et al. .................... 333/134
6,204,739 B1 * 3/2001   Sakamoto et al. ......... 333/134
6,232,854 B1 * 5/2001   Mikami et al. ............. 333/134
6,326,866 B1 * 12/2001  Sasaki et al. .............. 333/134

FOREIGN PATENT DOCUMENTS

JP    11-225088    8/1999

* cited by examiner

Primary Examiner—Michael Tokar
Assistant Examiner—Lam T. Mai
(74) Attorney, Agent, or Firm—Hogan & Hartson

(57) ABSTRACT

A high frequency module according to the present invention comprises a laminate board having a plurality of dielectric layers (11 to 18) stacked one on another, a branch filter circuit (DIP10) for separating a plurality of transceiver systems from each other, switch circuits (SW10, SW20) for switching the respective transceiver systems between transmitter branches (TX) and receiver branches (RX), power amplifiers (AMP10, AMP20) each comprising a matching circuit (MAT10, MAT20) and a high frequency amplification semiconductor device for amplifying a transmission signal having a frequency within a pass band of each of the transmitter branches (TX), and couplers (COP10, COP20) for monitoring outputs.

21 Claims, 11 Drawing Sheets

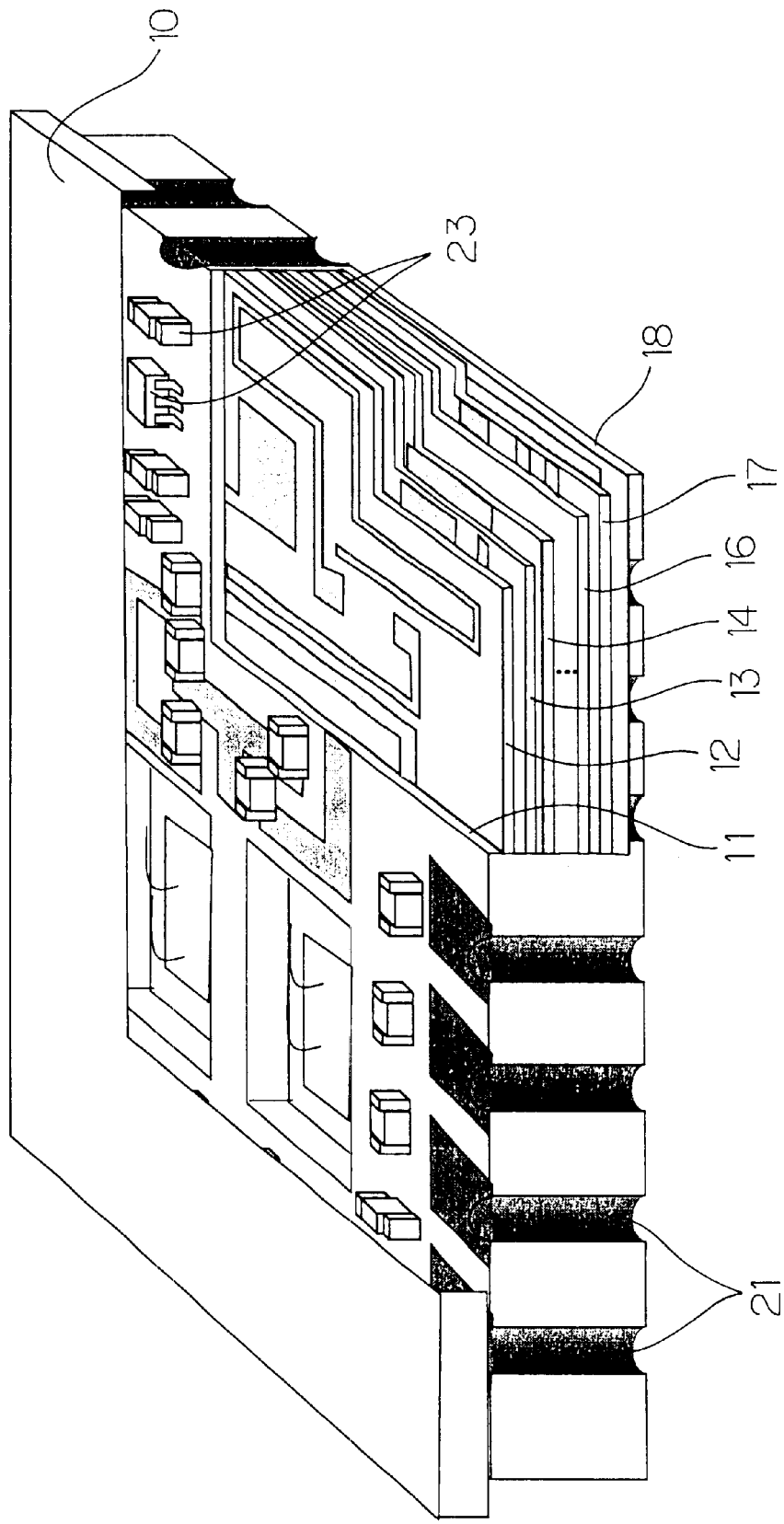

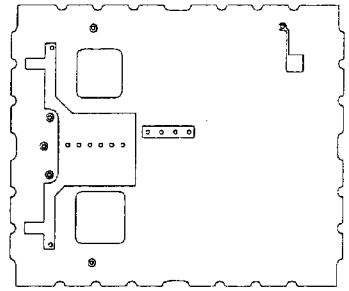
FIG. 4 ( d )
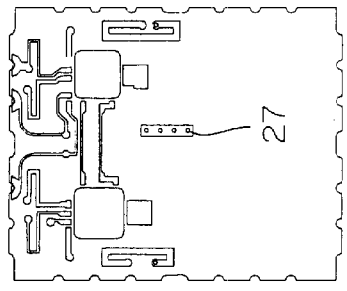
FIG. 4 ( c )
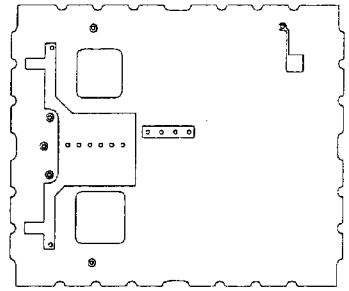
FIG. 4 ( b )
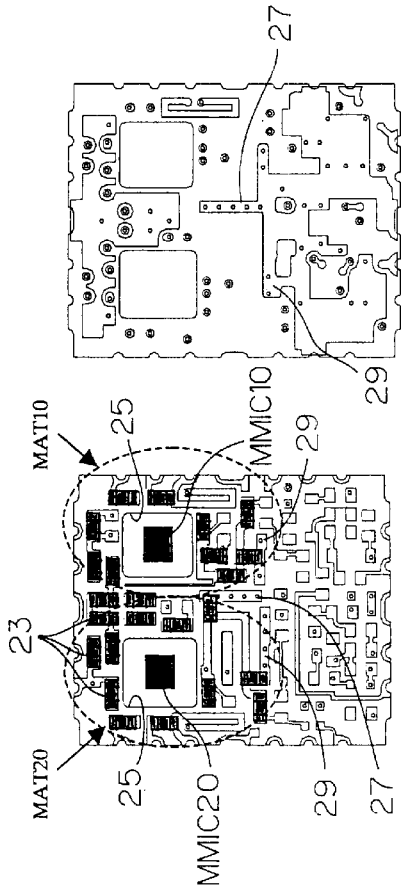
FIG. 4 ( a )
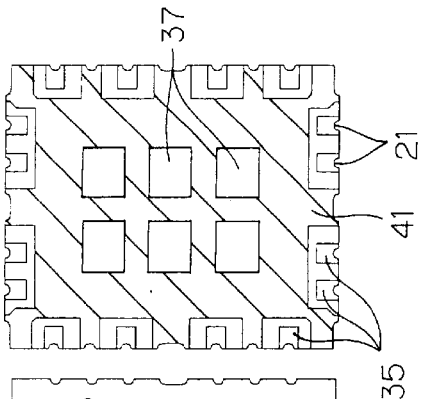
FIG. 4 ( i )
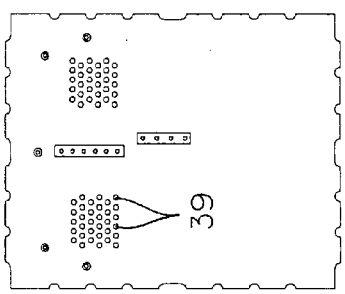
FIG. 4 ( h )
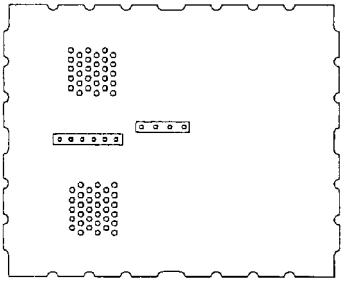
FIG. 4 ( g )
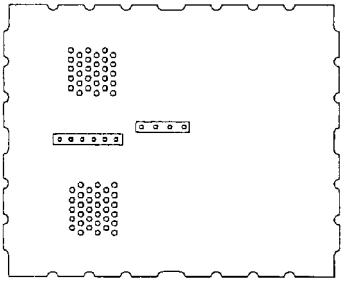
FIG. 4 ( f )
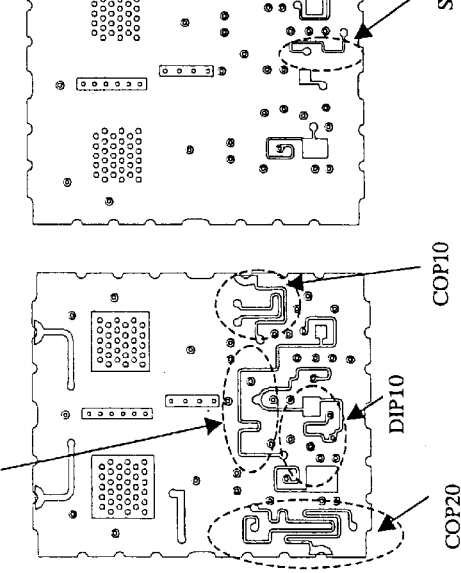
FIG. 4 ( e )

FIG. 8 (a)
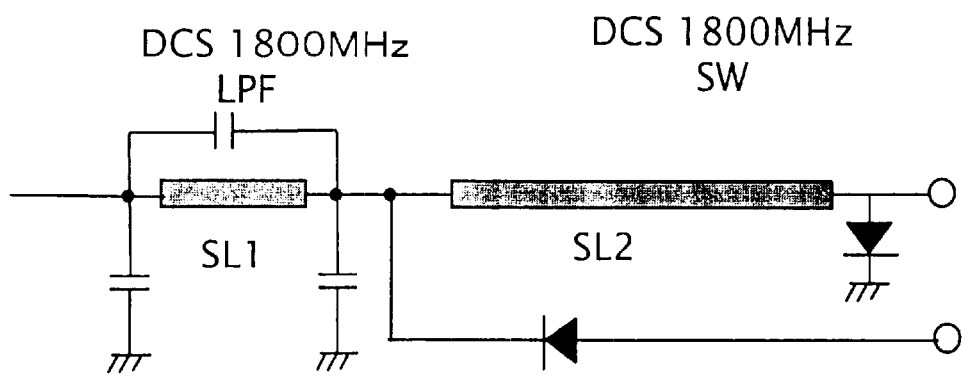
FIG. 8 (b)
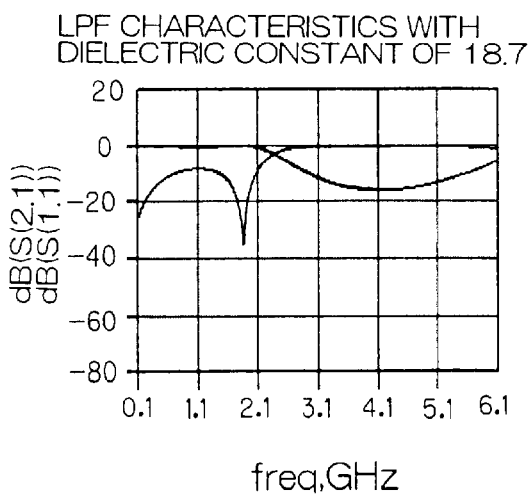
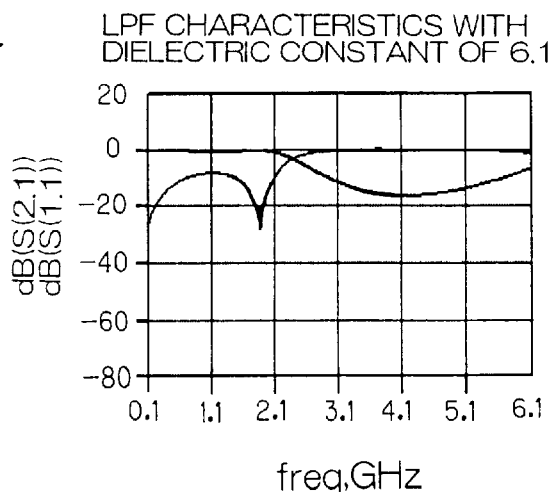

HIGH FREQUENCY MODULE HAVING A LAMINATE BOARD WITH A PLURALITY OF DIELECTRIC LAYERS

BACKGROUND OF THE INVENTION

1. Field of the Invention

The present invention relates to a high frequency module and, more particularly, to a high frequency transmitter module which comprises transmitter power amplifiers, switch circuits, couplers (directional couplers) and a branch filter circuit, and is suitable for a dual band mobile wireless terminal.

2. Description of Related Art

In recent years, dual band mobile phones have been proposed as an alternative to common mobile phones employing a single transceiver system. The dual band mobile phones include two transceiver systems which are selectively employed for signal transmission depending on regionalism and their intended use, and are promising as highly convenient mobile phones.

In European countries, dual band mobile phones have recently been used which employ a plurality of transceiver systems, i.e., a GSM system and a DCS system, having different communication bands.

FIG. 10 is a block diagram illustrating high frequency circuitry of a GSM/DCS dual band mobile phone. The high frequency circuitry comprises a switch module ASM1 which includes low pass filters, switch circuits and a branch filter circuit for separating two transceiver systems GSM and DCS having different pass bands from each other and switching the respective transceiver systems DCS and GSM between a transmitter side TX and a receiver side RX, a transmitter branch TX and a receiver branch RX for the transceiver system DCS, and a transmitter branch TX and a receiver branch RX for the transceiver system GSM.

The transmitter branches TX for the respective transceiver systems DCS and GSM include couplers COP100 and COP200, and power amplifiers AMP100 and AMP200. The power amplifiers AMP100, AMP200 each include a power amplification circuit MMIC and a matching circuit.

In signal transmission, transmission signals amplified by the power amplifier AMP100 or AMP200 on the transmitter side TX pass through the coupler COP100 or COP200 and further the high frequency switch module ASM1 including the low pass filters, the switch circuits and the branch filter circuit, and are at length transmitted as radio frequency signals from an antenna ANT.

On the other hand, the receiver branches RX for the respective transceiver systems DCS and GSM respectively include band pass filters BPF300 and BPF400, and low noise amplifiers AMP300 and AMP400. In signal reception, radio frequency signals received by the antenna ANT are introduced through the high frequency switch module ASM1 and, after unwanted signals having frequencies close to a reception band are removed from the received signals by the band pass filter BPF300 or BPF400, the resulting signals are amplified by the low noise amplifier AMP300 or AMP400 on the receiver side RX.

All the circuits required for construction of the respective transceiver systems should be mounted in the dual band mobile phone. Where components dedicated for the respective transceiver systems are employed for the construction of the circuitry, the size and costs of the dual band mobile phone are increased. Accordingly, there is a need to share common circuit components as much as possible for the size reduction and cost reduction of the mobile phone. Further, there is a need to improve the power application efficiencies of the transmitter power amplifiers which consume most of the power supplied to the mobile phone.

To meet these needs, Japanese Unexamined Patent Publication No. 11-225088 (1999), for example, discloses a multi-band high-frequency switch module ASM1 for size reduction.

FIG. 11 illustrates the multi-band high-frequency switch module ASM1. The multi-band high-frequency switch module ASM1 comprises a branch filter circuit including two notch circuits for separating two transceiver systems having different pass bands from each other, switch circuits SW for switching the respective transceiver systems between transmitter branches and receiver branches, and low pass filters LPF provided for the respective transmitter branches. In the branch filter circuit, the two notch circuits include LC devices connected in parallel. First terminals of the notch circuits are connected to each other to serve as a common terminal for the two transceiver systems, while second terminals of the notch circuits are connected to the respective switch circuits SW.

Nowadays, components of the high frequency switch in the dual band system are partly integrated into a module, as disclosed in Japanese Unexamined Patent Publication No. 11-225088 (1999), rather than mounted on a printed wiring board. However, this arrangement suffers from a limitation to the size reduction, because all the components of the high frequency switch module and the transmitter power amplifiers are mounted on the printed board.

Where the components of the high frequency switch module and the transmitter power amplifiers are mounted on the printed wiring board, the resulting high frequency circuitry rarely satisfies characteristic requirements for the mobile phone. Therefore, inter-component characteristic adjusting circuits are additionally required thereby to pose a design limitation. The provision of the additional circuits correspondingly increases the size of the mobile phone and reduces the power application efficiencies of the power amplifiers with a correspondingly greater power loss.

Further, couplers are provided for monitoring the outputs of the power amplifiers in some cases. Where the couplers are mounted on the printed wiring board, characteristic adjusting circuits for impedance matching should be provided between the couplers and the power amplifiers and between the couplers and the high frequency switch module. The provision of the additional circuits correspondingly increases the size of the mobile phone and reduces the power application efficiencies of the power amplifiers with a correspondingly greater power loss.

SUMMARY OF THE INVENTION

To solve the aforesaid problems, it is an object of the present invention to provide a high frequency module having advantageous characteristics in which components of circuitry ranging from power amplifiers to a branch filter circuit for separating a plurality of transceiver systems having different pass bands from each other are integrated for size reduction thereof.

In accordance with one aspect of the present invention, there is provided a high frequency module, which comprises: a laminate board having a plurality of dielectric layers stacked one on another; a branch filter circuit for separating a plurality of transceiver systems having different pass bands from each other; switch circuits connected to the branch filter circuit for switching the respective transceiver systems between transmitter branches and receiver branches; and power amplifiers respectively connected to the switch circuits and each comprising a matching circuit and a high frequency amplification semiconductor device for amplifying a transmission signal having a frequency within a pass band of each of the transmitter branches.

In the high frequency module, components of the circuitry ranging from the branch filter circuit to the power amplifiers are integrated for size reduction of the module. Further, the respective components can simultaneously be designed, so that the characteristics of the entire module can optimally be adjusted. Without the need for the provision of inter-component characteristic adjusting circuits, a power loss can be reduced. In addition, the time required for designing a mobile wireless terminal can be reduced for cost reduction.

In accordance with another aspect of the present invention, the high frequency module further comprises couplers provided in the laminate board for monitoring outputs of the power amplifiers.

Where the couplers for monitoring the outputs of the power amplifiers are integrated in the laminate board, the outputs of the power amplifiers can be monitored. Without the need for the provision of the characteristic adjusting circuits for the impedance matching, the size and the power loss can further be reduced, and the power application efficiencies of the power amplifiers can be improved.

In the present invention, interference preventing grounding patterns are preferably provided between the power amplifiers and the switch circuits and/or between the power amplifiers and the couplers. Thus, the leak of signals to the other circuits can be prevented which may otherwise occur due to electromagnetic coupling between the power amplifiers and the switch circuits and/or between the power amplifiers and the couplers. Thus, the high frequency module has advantageous characteristics.

The interference preventing grounding patterns are preferably provided on a surface of the laminate board and between the dielectric layers of the laminate board, and connected to each other through via-hole conductors. Thus, electromagnetic radiation from the power amplifiers can effectively be prevented from leaking to the couplers and the switch circuits through the inside of the laminate board.

In the high frequency module according to the present invention, the matching circuit preferably comprises distributed constant lines provided around the high frequency amplification semiconductor device on the surface of the laminate board and/or in the laminate board. Thus, the reduction in the output levels and power application efficiencies of the power amplifiers can be prevented, and the size of the high frequency transmission module can be reduced.

The matching circuit preferably comprises distributed constant lines provided between the high frequency amplification semiconductor device and the switch circuits and/or between the high frequency amplification semiconductor device and the couplers. Thus, wiring distances between the high frequency amplification semiconductor device and the switch circuit and/or between the high frequency amplification semiconductor device and the coupler can be minimized. Therefore, the reduction in the output levels and power application efficiencies of the power amplifiers can be prevented, and the size of the high frequency transmission module can be reduced.

In the present invention, it is preferred that the couplers and the power amplifiers for the respective pass bands are separately disposed as seen from the top of the laminate board. Thus, the electromagnetic coupling between the different transmission circuits can be reduced, whereby the leak of the signals to the other circuits is prevented.

In the present invention, the power amplifiers, the switch circuits and the branch filter circuit are preferably arranged in this order in the laminate board. Thus, the power amplifiers, the switch circuits and the branch filter circuit are arranged in a direction of the flow of the high frequency signals, whereby the length of the path of the high frequency signals is minimized. Therefore, the electrical performance of the module can be maximized.

In the present invention, the distributed constant lines of the matching circuits are preferably disposed in non-overlapped relation with respect to distributed constant lines of the switch circuits and/or distributed constant lines of the couplers as seen from the top of the laminate board. Thus, the leak of the signals from the power amplifiers to the other circuits can be prevented which may otherwise occur due to the electromagnetic coupling of the power amplifiers which emit electromagnetic radiation.

In the present invention, the branch filter circuit preferably has capacitor conductive patterns and distributed constant lines provided between the dielectric layers. The switch circuits preferably each have a concentrated constant device provided on the surface of the laminate board. The power amplifiers preferably each have the high frequency amplification semiconductor device provided in a cavity formed in the surface of the laminate board, distributed constant lines provided between the dielectric layers of the laminate board and on the surface of the laminate board, and a concentrated constant device provided on the surface of the laminate board. Further, the couplers preferably each have distributed constant lines provided between the dielectric layers, and a concentrated constant device provided on the surface of the laminate board.

In the present invention, the dielectric layers preferably each have a dielectric constant of 15 to 25. Thus, the distributed constant lines of the respective circuits each have a reduced length, thereby allowing for size reduction.

In the present invention, a signal terminal pattern, a grounding terminal pattern and a bias terminal pattern are preferably provided in a peripheral area of a lower surface of the laminate board, and respectively connected to side-face through-hole electrodes provided on a side face of the laminate board. A grounding pattern is preferably provided in a center area of the lower surface of the laminate board and connected to the grounding terminal pattern. The grounding pattern is coated with an overcoat glass so that plural portions thereof are exposed from the overcoat glass. A thermal via is preferably connected to the grounding pattern. Thus, the deterioration of the characteristics of the high frequency module (e.g., the reduction in output levels and power application efficiencies) can be prevented, which may otherwise occur due to heat generated by the high frequency module.

In the present invention, the branch filter circuit preferably has a low pass filter and/or a high pass filter provided in the multi-layer board.

The couplers preferably each include a distributed constant line and a capacitor provided in the multi-layer board to provide a low pass filter function. Thus, unwanted signals generated by the power amplifiers can be reduced.

The matching circuits preferably each have a distributed constant line and a capacitor provided on the outermost surface of the multi-layer board or in the multi-layer board to provide a low pass filter function. Thus, unwanted signals generated by the high frequency amplification semiconductor device can be reduced.

Further, DC cut-off capacitors are preferably provided between the power amplifiers and the couplers or between the couplers and the switch circuits. This prevents a PIN diode control current from flowing into the power amplifiers, and prevents a power amplifier driving current from flowing into the grounding terminal through the switch circuits.

With the aforesaid arrangements, the components of the circuitry ranging from the branch filter circuit to the power amplifiers are integrated in the inventive high frequency module, so that the mounting area on the printed wiring board can be reduced to about one fourth or less as compared with a conventional module in which all the circuit components are mounted on the surface of the printed wiring board and connected to each other. Thus, the high frequency module has a reduced size and advantageous characteristics with a drastically improved power application efficiency at the antenna terminal.

Since the respective components of the high frequency module can simultaneously be designed, the characteristics of the module can optimally be adjusted. Without the need for the provision of the inter-component characteristic adjusting circuits, the power loss can be reduced, and the time required for designing a mobile wireless terminal can be reduced for cost reduction.

With reference to the attached drawings, the present invention will hereinafter be described by way of specific embodiments thereof.

BRIEF DESCRIPTION OF THE DRAWINGS

FIG. 3 is a partly broken perspective view of the inventive high frequency module;

FIGS. 4(a) to 4(i) are plan views illustrating dielectric layers of the inventive high frequency module;

FIG. 8(a) is a circuit diagram illustrating a switch circuit, and FIG. 8(b) is graphs showing low pass filter characteristics observed when the dielectric layers are composed of a material having a high dielectric constant and when the dielectric layers are composed of a material having a low dielectric constant;

DESCRIPTION OF THE PREFERRED EMBODIMENTS

Figure 1:
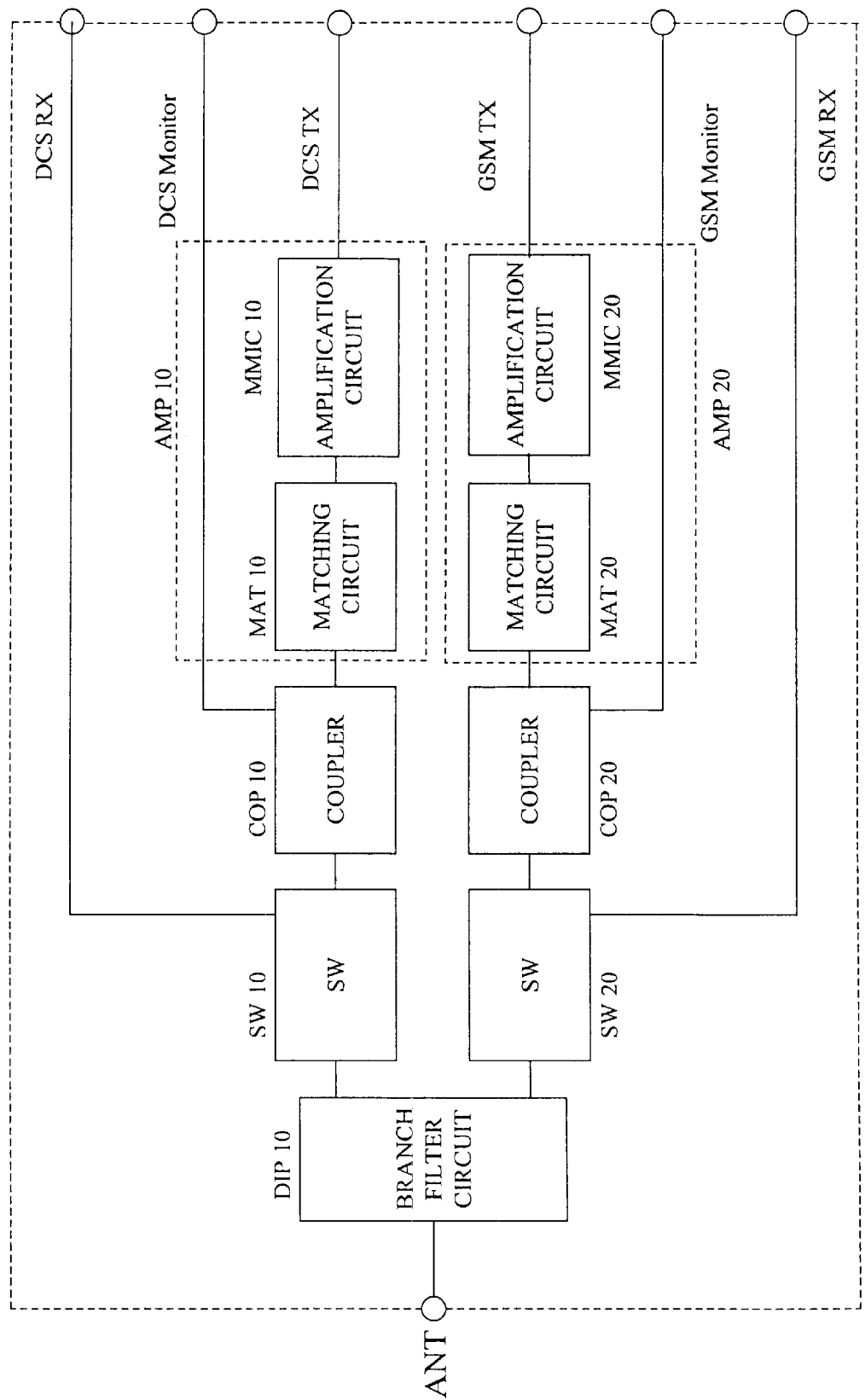
FIG. 1 is a block diagram of a high frequency module according to the present invention.

FIG. 1 is a block diagram of a high frequency module according to the present invention. The high frequency module RFM10 includes: a branch filter circuit DIP10 for separating a plurality of transceiver systems DCS, GSM having different pass bands from each other; switch circuits SW10, SW20 for switching the respective transceiver systems DCS, GSM between transmitter branches TX and receiver branches RX; couplers COP10, COP20 provided on a transmitter side of the switch circuits SW10, SW20 for monitoring outputs of the amplifiers AMP10, AMP20; and matching circuits MAT10, MAT20 and amplification circuits MMIC10, MMIC20, constituting amplifiers AMP10, AMP20.

The amplification circuits MMIC10, MMIC20 each have the function of amplifying an input signal, and comprise a semiconductor device having a GaAs HBT (gallium-arsenic hetero-junction bipolar transistor) structure for size reduction and efficiency improvement. Although the GaAs HBT semiconductor device is employed as the amplification circuit MMIC10, MMIC20 in this embodiment, a GaAs semiconductor device of a P-HEMT structure or a semiconductor device of a silicon transistor may be employed.

The matching circuits MAT10, MAT20 each have the function of transforming the output impedance of the amplification circuit MMIC10, MMIC20 from 0.5–2 Ω to 30–50 Ω, the function of maximizing the amplification performance of the amplification circuit MMIC10, MMIC20, and the function of matching the impedance of the coupler COP10, COP20 with the impedance of the power amplifier AMP10, AMP20. The power amplifiers AMP10, AMP20 are each constituted by the amplification circuit MMIC10, MMIC20 and the matching circuit MAT10, MAT20 as described above.

Figure 2:
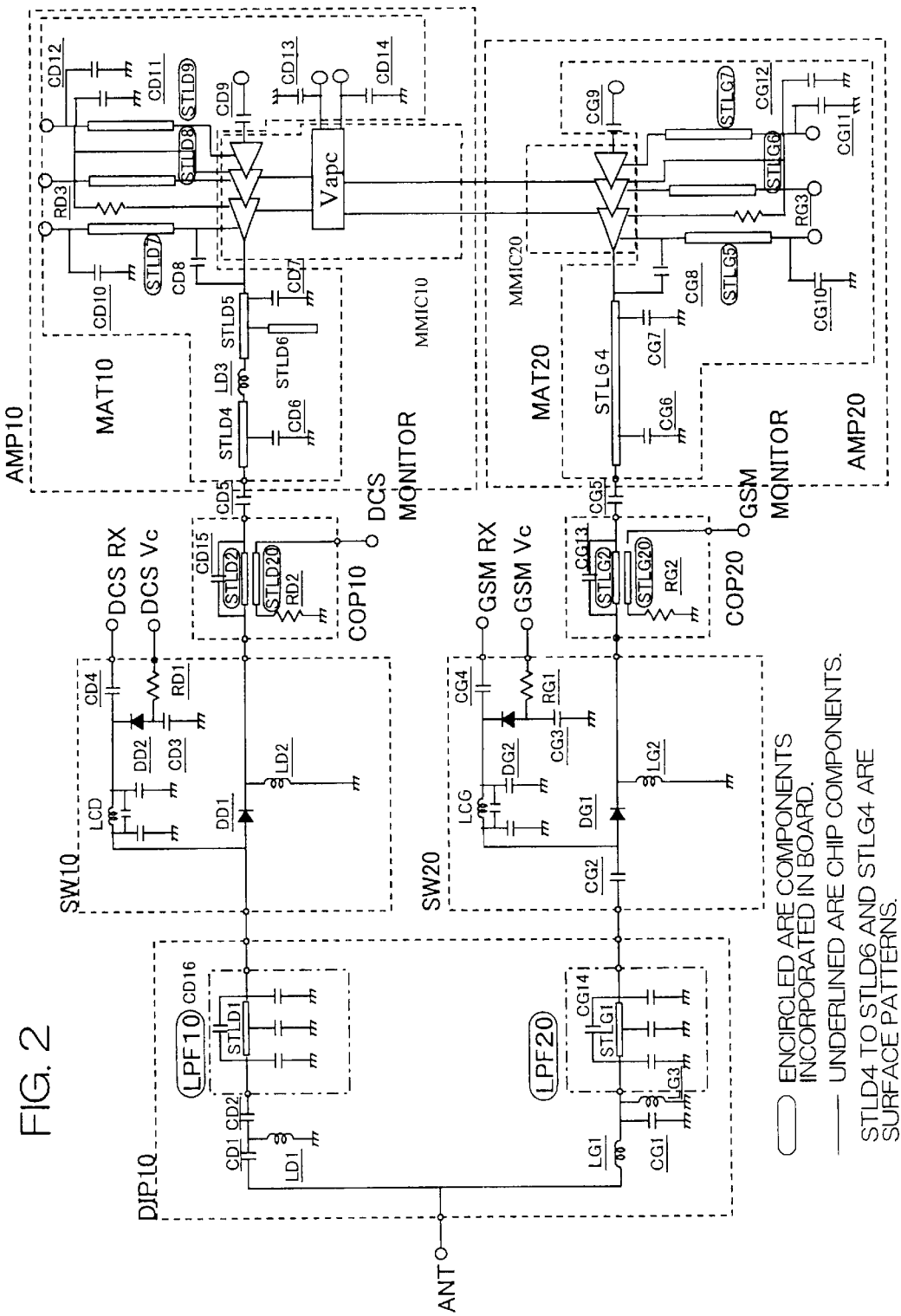
FIG. 2 is a circuit diagram of the inventive high frequency module.

FIG. 2 is a circuit diagram of the high frequency module shown in FIG. 1. The inventive high frequency module includes the DCS transceiver system (having a pass band of 1,800 MHz) and the GSM transceiver system (having a pass band of 900 MHz) A DCS signal and a GSM signal are separated from each other on a circuit basis by the branch filter circuit DIP10.

An antenna ANT is connected to the switch circuits SW10, SW20 via the branch filter circuit DIP10. DCS signals received by the antenna ANT are introduced into the DCS transceiver system through the branch filter circuit DIP10, while GSM signals received by the antenna ANT are introduced into the GSM transceiver system through the branch filter circuit DIP10.

First, an explanation will be given to a circuit configuration of the DCS system. The switch circuit SW10 switches the DCS transceiver system between the receiver branch RX and the transmitter branch TX. A time division switching method, for example, is employed for the switching between the transmission and the reception. The amplifier AMP10 constituted by the amplification circuit MMIC10 and the matching circuit MAT10 and the coupler COP10 connected to the matching circuit MAT10 are provided on the transmitter side TX of the switch circuit SW10.

The matching circuit MAT10 includes distributed constant lines STLD4, STLD5, STLD6, STLD7, STLD8, STLD9, an inductor LD3, capacitors CD6, CD7, CD8, CD9, CD10, CD11, CD12, CD13, CD14, and a chip resistor RD3. The distributed constant lines STLD4, STKD5, the inductor LD3 and the capacitors CD6, CD7 constitute a low pass filter. The low pass filter has the function of matching the output impedance (about 0.5 Ω to about 2 Ω) of the amplification circuit MMIC10 with the input impedance (about 30 Ω to about 50 Ω) of the coupler COP10, and the function of reducing unwanted signals generated by the amplification circuit MMIC10.

The distributed constant line STLD7, together with the capacitor CD10, constitutes a short stub to match the output impedance (about 0.5 Ω to about 2 Ω) of the amplification circuit MMIC10 with the input impedance (about 30 Ω to about 50 Ω) of the coupler COP10 and, together with the distributed constant line STLD6, constitutes an open stub circuit to suppress a higher harmonic component and maximize the amplification performance of the amplification circuit MMIC10.

The distributed constant lines STLD8, STLD9 serve for impedance matching of three stage amplifiers of the amplification circuit MMIC10 to match the impedance of an intermediate amplifier with the impedance of a final amplifier and to match the impedance of an initial amplifier with the impedance of the intermediate amplifier.

The capacitor CD8 constitutes a feedback circuit for feedback from an output terminal of the amplification circuit MMIC10 to the amplification circuit MMIC10 so as to prevent oscillation of the amplification circuit MMIC10. The capacitors CD11, CD12, CD13, CD14 each serve as a bypass capacitor. The capacitor CD9 serves to prevent a DC component from flowing into an input terminal of the amplification circuit MMIC10.

The amplification circuit MMIC10 includes an APC circuit for controlling outputs of the amplifiers AMP10, AMP20, and a GSM-DCS output switching circuit. Functions to be effected by these circuits may be incorporated in the amplification circuit MMIC20.

The coupler COP10 includes a distributed constant line STLD2 and a capacitor CD15 which constitute a low pass filter. The low pass filter reduces unwanted signals generated by the power amplifier AMP10. The coupler COP10 is not necessarily required to have a low pass filter function, but may only comprise the distributed constant line STLD2 without the provision of the capacitor CD15 to pass signals having frequencies within the DCS frequency band.

A coupling line STLD20 is provided in the vicinity of the distributed constant line STLD2 to establish a capacitive coupling and a magnetic coupling, whereby a part of the output of the amplification circuit MMIC10 on the transmitter circuit side TX is fed as a monitor level back to a DCS monitor terminal. The coupling line STLD20 is connected to a terminal resistor RD2 on the side of the switch circuit SW10.

The coupler COP10 is connected to the amplifier AMP10 via a DC cut-off capacitor CD5.

The coupler COP10 is further connected to a cathode of a PIN diode DD1 of the switch circuit SW10. The cathode of the PIN diode is grounded via an inductor LD2 so as to prevent the deterioration of high frequency band pass characteristics and to apply a direct current for driving the PIN diode DD1.

An anode of the PIN diode DD1 is connected to a low pass filter LPF10 of the branch filter circuit DIP10 and to a DCS RX terminal via an LC circuit LCD and a DC cut-off capacitor CD4 of the switch circuit SW10. The LC circuit LCD includes an inductor and a capacitor. The inductor is provided in a chip form on a laminate board, while the capacitor is incorporated in the laminate board. The LC circuit LCD may be constituted by distributed constant lines.

A junction between the LC circuit LCD and the capacitor CD4 is connected to a cathode of a PIN diode DD2, and an anode of the PIN diode DD2 is grounded via a capacitor CD3. A junction between the anode of the PIN diode DD2 and the capacitor CD3 is connected to a DCS control terminal Vc via a control resistor RD1 for controlling an electric current flowing through the PIN diode DD2.

A DC cut-off capacitor CD5 is provided between the coupler COP10 and the amplifier AMP10, whereby the control current applied from the DCS control terminal Vc through the PIN diode DD1 is prevented from flowing into the amplifier AMP10. Further, a collector current of the amplification circuit MMIC10 of the amplifier AMP10 is prevented from flowing into a grounding terminal GND through the matching circuit MAT10 and the inductor LD2.

The DC cut-off capacitor CD5 separates the amplifier AMP10 from the branch filter circuit DIP10, the switch circuit SW10 and the coupler COP10, whereby these circuits can individually be checked for electrical failures occurring in the module. A DC cut-off capacitor CD5 may be provided between the switch circuit SW10 and the coupler COP10 to provide the same effect. Further, DC cut-off capacitors CD5 may be provided between the coupler COP10 and the amplifier AMP10 and between the switch circuit SW10 and the coupler COP10.

The branch filter circuit DIP10 includes a low pass filter LPF10, capacitors CD1, CD2 and an inductor LD1. The low pass filter LPF10 includes a distributed constant line STLD1, a capacitor CD16 disposed parallel to the distributed constant line STLD1, and other capacitors. The low pass filter LPF10 has the function of reducing a higher harmonic component generated by the power amplifier AMP10, and the function of finely adjusting the impedance of the branch filter circuit DIP10. The inductor LD1 is designed to function as a branch filter and as an ESD protection circuit.

Next, an explanation will be given to a circuit configuration of the GSM system. The switch circuit SW20 switches the GSM transceiver system between the receiver branch RX and the transmitter branch TX. A time division switching method, for example, is employed for the switching between the transmission and the reception. The amplifier AMP20 constituted by the amplification circuit MMIC20 and the matching circuit MAT20 and the coupler COP20 connected to the matching circuit MAT20 are provided on the transmitter side TX of the switch circuit SW20.

The matching circuit MAT20 includes distributed constant lines STLG4, STLG5, STLG6, STLG7, capacitors CG6, CG7, CG8, CG9, CG10, CG11, CG12, and a chip resistor RG3. The distributed constant line STLG4 and the capacitors CG6, CG7 constitute a low pass filter.

The low pass filter has the function of matching the output impedance (about 0.5 Ω to about 2 Ω) of the amplification circuit MMIC20 with the input impedance (about 30 Ω to about 50 Ω) of the coupler COP20, and the function of reducing unwanted signals generated by the amplification circuit MMIC20.

The distributed constant line STLG5, together with the capacitor CG10, constitutes a short stub to match the output impedance (about 0.5 Ω to about 2 Ω) of the amplification circuit MMIC20 with the input impedance (about 30 Ω to about 50 Ω) of the coupler COP20, to suppress a higher harmonic component, and to maximize the amplification performance of the amplification circuit MMIC20.

The distributed constant lines STLG6, STLG7 serve for impedance matching of three stage amplifiers of the amplification circuit MMIC20 to match the impedance of an intermediate amplifier with the impedance of a final amplifier and to match the impedance of an initial amplifier with the impedance of the intermediate amplifier.

The capacitor CG8 constitutes a feedback circuit for feedback from an output terminal of the amplification circuit MMIC20 to the amplification circuit MMIC20 so as to prevent oscillation of the amplification circuit MMIC20. The capacitors CG11, CG12 each function as a bypass capacitor. The capacitor CG9 serves to prevent a DC component from flowing into an input terminal of the amplification circuit MMIC20.

That is, the matching circuit MAT20 serves to match the output impedance (about 0.5 Ω to about 2 Ω) of the amplification circuit MMIC20 with the input impedance (about 30 Ω to about 50 Ω) of the coupler COP20, to suppress a higher harmonic component, and to maximize the amplification performance of the amplification circuit MMIC20.

The coupler COP20 includes a distributed constant line STLG2 and a capacitor CG13 which constitute a low pass filter. The low pass filter reduces unwanted signals generated by the power amplifier AMP20. The coupler COP20 is not necessarily required to have a low pass filter function, but may comprise the distributed constant line STLG2 alone without the provision of the capacitor CG13 to pass signals having frequencies within the GSM frequency band.

A coupling line (distributed constant line) STLG20 is provided in the vicinity of the distributed constant line STLG2 to establish a capacitive coupling and a magnetic coupling, whereby a part of the output of the amplification circuit MMIC20 on the transmitter circuit side TX is fed as a monitor level back to a GSM monitor terminal. The coupling line STLG20 is connected to a terminal resistor RG2 on the side of the switch circuit SW20.

The coupler COP20 is connected to the amplifier AMP20 via a DC cut-off capacitor CG5. The coupler COP20 is further connected to a cathode of a PIN diode DG1. The cathode of the PIN diode DG1 is grounded via an inductor LG2.

An anode of the PIN diode DG1 is connected to a low pass filter LPF20 of the branch filter circuit DIP10 and to a GSM RX terminal via an LC circuit LCG and a DC cut-off capacitor CG4. A junction between the LC circuit LCG and the capacitor CG4 is connected to a cathode of a PIN diode DG2, and an anode of the PIN diode DG2 is grounded via a capacitor CG3. A junction between the anode of the PIN diode DG2 and the capacitor CG3 is connected to a GSM control terminal Vc via a control resistor RG1.

The LC circuit LCG includes an inductor and a capacitor. The inductor is provided in a chip form on the laminate board, while the capacitor is incorporated in the laminate board. The LC circuit LCG may be constituted by distributed constant lines.

A DC cut-off capacitor CG5 is provided between the coupler COP20 and the amplifier AMP20, whereby the control current applied from the GSM control terminal Vc through the PIN diode DG1 is prevented from flowing into the amplifier AMP20. Further, a collector current of the amplification circuit MMIC20 of the amplifier AMP20 is prevented from flowing into a grounding terminal GND through the matching circuit MAT20 and the inductor LG2. The DC cut-off capacitor CG5 separates the amplifier AMP20 from the branch filter circuit DIP10, the switch circuit SW20 and the coupler COP20, whereby these circuits can individually be checked for electrical failures occurring in the module. The DC cut-off capacitor CG5 may be provided between the switch circuit SW20 and the coupler COP20.

Further, a DC cut-off capacitor CG2 is provided between the PIN diode DG1 and the low pass filter LPF20.

The branch filter circuit DIP10 connected to the GSM system includes a low pass filter LPF20, a capacitor CG1 and inductors LG1, LG3. The low pass filter LPF20 includes a distributed constant line STLG1, a capacitor CG14 disposed parallel to the distributed constant line STLG1, and other capacitors. The low pass filter LPF20 has the function of reducing a higher harmonic component generated by the power amplifier AMP20, and the function of finely adjusting the impedance of the branch filter circuit DIP10. The inductor LG3 is designed to serve for ESD protection.

In the inventive high frequency transmitter module REM10, chip components (concentrated constant devices) including the capacitors, the inductors and the diodes constituting the branch filter circuit DIP10, the switch circuits SW10, SW20, the couplers COP10, COP20 and the matching circuits MAT10, MAT20 are provided on the laminate board which has a plurality of dielectric layers stacked one on another. At least some of the components of the branch filter circuit DIP10, the switch circuits SW10, SW20, the couplers COP10, COP20 and the matching circuits MAT10, MAT20 are provided in the laminate board.

In the embodiment shown in FIG. 2, the low pass filters LPF10, LPF20 constituting parts of the branch filter circuit DIP10 are incorporated in the laminate board. The distributed constant lines STLD2, STLG2 and the coupling lines STLD20, STLG20 of the couplers COP10, COP20, and the distributed constant lines STLD7, STLD8, STLD9, STLG5, STLG6, STLG7 of the matching circuits MAT10, MAT20 are provided as conductive patterns between the dielectric layers. The distributed constant lines STLD4, STLD5, STLD6, STLG4 of the matching circuits MAT10, MAT20 are provided as conductive patterns on the surface of the laminate board.

The chip components (e.g., the PIN diodes) constituting parts of the branch filter circuit DIP10, the switch circuits SW10, SW20, the couplers COP10, COP20 and the matching circuits MAT10, MAT20 are mounted on the uppermost dielectric layer (on the upper surface of the laminate board).

That is, the branch filter circuit DIP10 has capacitor conductive patterns and distributed constant lines provided between the dielectric layers, and chip components. The switch circuits SW10, SW20 have chip components (i.e., diodes, resistors, capacitors and inductors) mounted on the surface of the laminate board, and capacitor conductive patterns provided between the dielectric layers. The couplers COP10, COP20 have distributed constant lines provided between the dielectric layers, and chip components (i.e., capacitors and resistors) mounted on the surface of the laminate board. The power amplifiers AMP10, AMP20 each have a high frequency amplification semiconductor device provided in a cavity formed in the surface of the laminate board, distributed constant lines provided between the dielectric layers, and chip components (i.e., capacitors and resistors) and distributed constant lines provided on the surface of the laminate board.

More specifically, circuit components each denoted by an encircled reference character in FIG. 2 are conductive patterns incorporated between the dielectric layers, and devices each denoted by an underlined reference character in FIG. 2 are chip components (concentrated constant devices).

FIG. 3 is a partly broken perspective view of the inventive high frequency module. As shown in FIG. 3, the laminate board of the high frequency module includes eight ceramic dielectric layers 11 to 18 having the same dimensional configuration, and the upper face and side faces of the laminate board are covered with a metal shield cover 10. A plurality of side-face through-hole electrodes 21 are provided in predetermined positions of side faces of the laminate board as extending from the upper surface to a lower surface of the board.

The shield cover 10 is fixed to one or more of grounding side-face through-hole electrodes 21 provided in predetermined positions of the side faces with the use of a conductive material such as a solder. In FIG. 3, some of the conductive patterns provided on the upper surfaces of the dielectric layers 11 to 18 are not shown.

The dielectric layers 11 to 18 are each composed of a ceramic material adapted for low-temperature sintering, and the laminate board is produced by applying a conductive paste on surfaces of ceramic green sheets for formation of the conductive patterns (the circuit components denoted by encircled reference characters in FIG. 2) of the aforesaid circuits, stacking the green sheets formed with the conductive patterns, and heat- and press-bonding the green sheets under a predetermined pressure at a predetermined temperature for sintering thereof. Via-hole conductors are provided in the dielectric layers 11 to 18 so that circuits are produced across the plurality of dielectric layers and circuits produced on different dielectric layers are connected to each other. Besides the conductive patterns, a plurality of chip components (concentrated constant devices) 23 such as PIN diodes are mounted on the uppermost dielectric layer 11.

FIGS. 4(a) to 4(i) are plan views separately illustrating the respective dielectric layers 11 to 18. Particularly, FIG. 4(a), 4(b), 4(c), 4(d), 4(e), 4(f), 4(g) and 4(h) illustrate front surfaces of the dielectric layers 11, 12, 13, 14, 15, 16, 17 and 18, respectively, and FIG. 4(i) illustrates aback surface of the dielectric layer 18. In FIGS. 4(a) to 4(i), some of the patterns and the circuit components are not shown. FIGS. 4(e) and 4(f) illustrate a case where distributed constant lines are employed for the formation of the LC circuits LCD, LCG of the switch circuits SW10, SW20.

FIG. 4(a) illustrates the arrangement of the distributed constant lines and the chip components of the matching circuits MAT10, MAT20, and the arrangement of the amplification circuits MMIC10, MMIC20. In this embodiment, the amplification circuits MMIC10, MMIC20 of the amplifiers AMP20, AMP10 are respectively provided in two cavities 25 formed in the surface of the laminate board of the low-temperature sintered ceramic. The distributed constant lines STLD4 to STLD6, STLG4 and chip components (the capacitors and the like) 23 of the matching circuits MAT10 and MAT20 respectively connected to the amplification circuits MMIC10 and MMIC20 are provided around the cavities 25 on the surface of the dielectric layer 11. The distributed constant lines STLD7 to STLD9 and STLG5 to STLG7 of the matching circuits MAT10 and MAT20 are provided around the cavities 25 in the laminate board.

Input terminals and power supply terminals for driving or controlling the amplifiers AMP10, AMP20 are also provided around the cavities 25 on one side of the laminate board. This arrangement obviates needless routing to prevent the reduction in output level and power application efficiency which may otherwise occur due to the mismatch of the impedances and the reduction in voltages supplied for driving or controlling the amplifiers AMP10, AMP20. Since the arrangement of the circuit components can be optimized without the needless routing, the size of the amplifiers AMP10, AMP20 and, hence, the size of the entire high frequency transmitter module can be reduced.

Where the matching circuits MAT10, MAT20 of the amplifiers AMP10, AMP20 for amplifying transmission signals having different frequencies (e.g., GSM and DCS) are disposed in close relation with respect to each other for size reduction of the module, a higher harmonic component of the GSM transmission signals are disadvantageously outputted from the antenna terminal via the DCS matching circuit MAT10 due to the electromagnetic coupling between the matching circuits MAT10 and MAT20. Therefore, grounding patterns 27 are provided on and in the laminate board between the matching circuits MAT10 and MAT20 disposed in close relation.

With this arrangement, an electric field generated by the distributed constant lines of the matching circuit MAT20 is concentrated on the grounding patterns 27 provided between the matching circuits MAT10 and MAT20, whereby the higher harmonic component outputted to the antenna terminal ANT via the matching circuit MAT10 can be minimized. Further, the grounding patterns 27 can be used as pads for the grounding capacitors of the matching circuits MAT10, MAT20, contributing to size reduction. The grounding patterns 27 are provided on the respective dielectric layers 11 to 18, and connected to grounding patterns 37 provided on the lower surface of the dielectric layer 18 through via-hole conductors.

Figure 5:
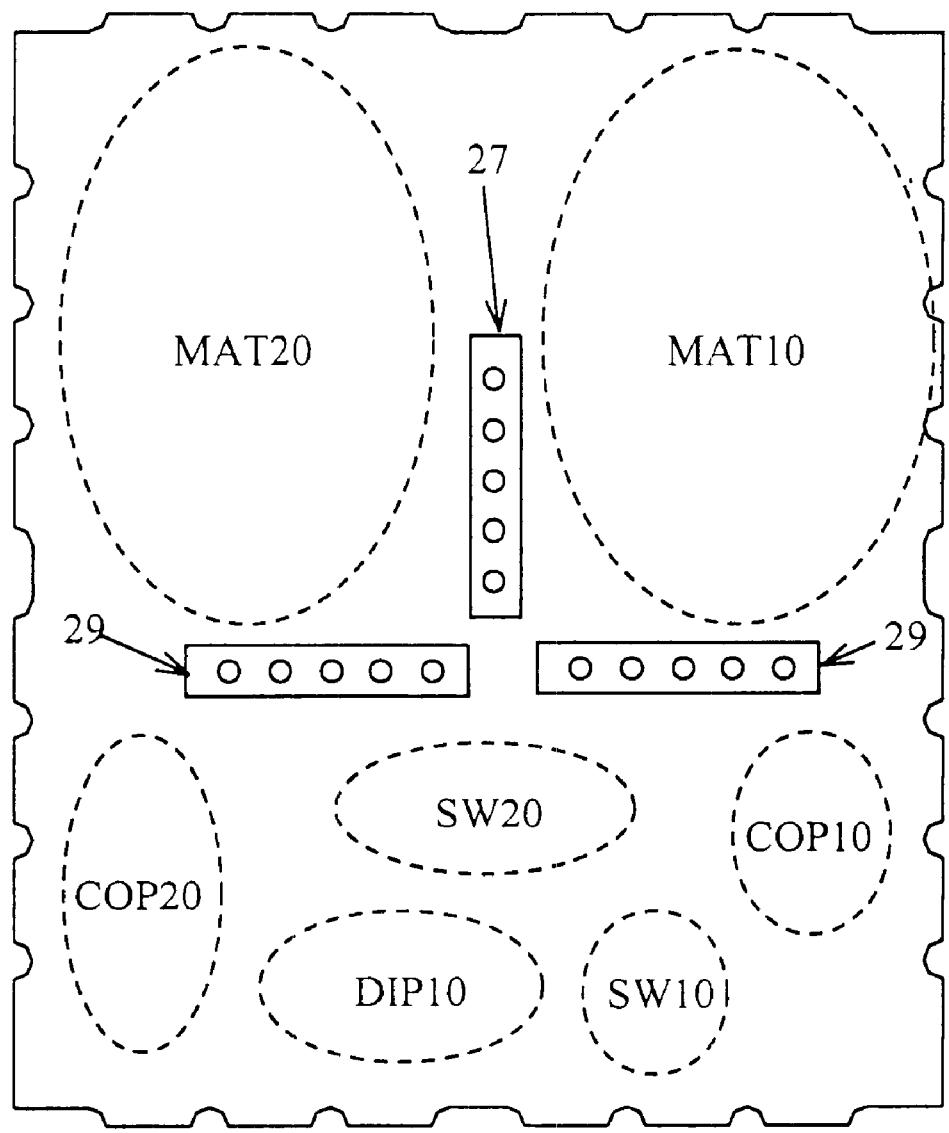
FIG. 5 is a schematic diagram for explaining the arrangement of circuits of the inventive high frequency module.

FIGS. 4(a), 4(e) and 4(f) illustrate the arrangement of the matching circuits MAT10, MAT20 of the amplifiers AMP10, AMP20 and the couplers COP10, COP20. A combination of the coupler COP10 and the matching circuit MAT10 for the DCS system and a combination of the coupler COP20 and the matching circuit MAT20 for the GSM system are separately disposed on opposite sides of the laminate board. FIG. 5 is a schematic diagram illustrating this arrangement as seen from the top of the laminate board. This arrangement reduces the electromagnetic coupling between the DCS circuitry and the GSM circuitry, preventing signals from leaking to the other circuits.

The amplifiers AMP10, AMP20 are disposed on one of the longitudinally opposite sides of the ceramic laminate board of the inventive module. The couplers COP10, COP20, the switch circuits SW10, SW20 and the branch filter circuit DIP10 are disposed on the other side of the laminate board separately from the amplifiers AMP10, AMP20. The switch circuits SW10, SW20 and the branch filter circuit DIP10 are disposed between the couplers COP10 and COP20. That is, the amplifiers AMP10, AMP20, the switch circuits SW10, SW20 and the branch filter circuit DIP10 are arranged in this order longitudinally of the laminate board or in the direction of the flow of the high frequency signals. With this arrangement, the length of the high frequency signal flow path is minimized, so that the electrical performance of the module can be maximized.

Further, the amplifiers AMP10, AMP20, the switch circuits SW10, SW20 and the branch filter circuit DIP10 are disposed in this order longitudinally of the board. The distributed constant lines of the matching circuits MAT10, MAT20 are disposed in non-overlapped relation with respect to the distributed constant lines of the couplers COP10, COP20 and the switch circuits SW10, SW20 as seen from the top of the board.

In the inventive high frequency module, interference preventing grounding patterns 29 are provided between the amplifiers AMP10, AMP20, and the switch circuits SW10, SW20 and the couplers COP10, COP20. The interference preventing grounding patterns 29 are provided on the upper surface of the board and on the upper surface of the dielectric layer 12. These interference preventing grounding patterns 29 are connected to each other and further to the grounding patterns 37 provided on the back surface of the dielectric layer 18 by via-hole conductors. The interference preventing grounding patterns 29 separate the power amplifiers AMP10, AMP20 from the couplers COP10, COP20 for monitoring the outputs of these power amplifiers, from the branch filter circuit DIP10 for separating the plurality of transceiver systems having different pass bands from each other, and from the switch circuits SW10, SW20 for switching the respective transceiver systems between the transmitter branches and the receiver branches. Thus, the leak of the signals to the other circuits can be prevented, which may otherwise occur due to the electromagnetic coupling between the power amplifiers AMP10, AMP20, and the couplers COP10, COP20, the branch filter circuit DIP10 and the switch circuits SW10, SW20.

Figure 6:
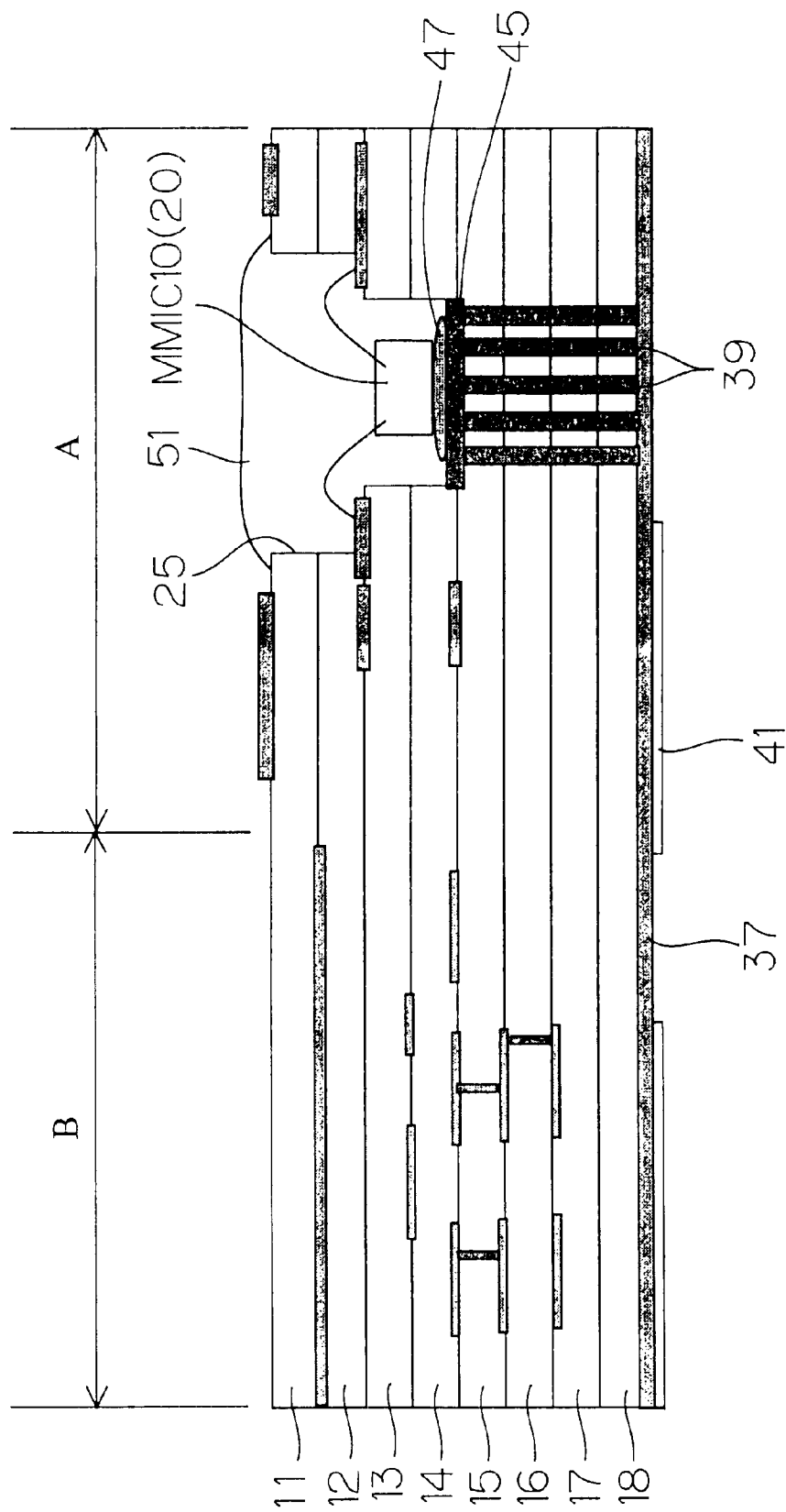
FIG. 6 is a sectional view of the inventive high frequency module.

FIG. 6 is a sectional view of the ceramic laminate board of the high frequency module. As shown, the matching circuits MAT10, MAT20 of the amplifiers AMP10, AMP20 are disposed in a region A on one side f the laminate board. The distributed constant lines of the branch filter circuit DIP10, the distributed constant lines of the switch circuits SW10, SW20, and the distributed constant lines of the couplers COP10, COP20 are disposed in a region B on the other side of the laminate board. The distributed constant lines of the matching circuits MAT10, MAT20 of the amplifiers AMP10, AMP20 are disposed in non-overlapped relation with respect to the distributed constant lines of the branch filter circuit DIP10, the switch circuits SW10, SW20 and the couplers COP10, COP20 as seen in a laminating direction along the thickness of the laminate board.

With this arrangement, the leak of signals from the matching circuits MAT10, MAT20 to the other circuits can be prevented, which may otherwise occur due to electromagnetic coupling.

Portions of the first to fourth dielectric layers from the surface of the laminate board are removed so as to form two adjacent two-stage cavities. A signal pattern and a grounding pattern are provided on the surface of the first stage of each of the cavities, and the amplification circuits MMIC10, MMIC20 are each fixed onto a grounding terminal pattern 45 provided on the surface of the second stage of the cavity with the use of an electrically conductive paste 47. Input and output electrodes of the amplification circuit MMIC10, MMIC20 are connected to the signal pattern and the grounding pattern provided on the first stage of the cavity by wires.

Terminal patterns 35 including signal terminal patterns, grounding patterns and bias supply terminal patterns for external connection are provided in a peripheral area of the lowermost surface of the laminate board or the back surface of the dielectric layer 18 as shown in FIG. 4(i). The predetermined number of side-face through-hole electrodes 21 are provided in the predetermined positions on the side faces of the laminate board as extending from the upper surface to the lower surface of the board, and connected to the terminal patterns (the signal terminal patterns, the grounding terminal patterns and the bias supply terminal patterns) 35 provided in the peripheral area of the lower surface of the lowermost dielectric layer of the low-temperature sintered multi-layer board.

One or more grounding patterns 37 of LGA structure are provided in a center area of the lower surface of the lowermost dielectric layer of the low-temperature sintered multi-layer board, and connected to the grounding patterns provided in the peripheral area of the lower surface of the lowermost dielectric layer of the low-temperature sintered multi-layer board.

The LGA grounding patterns 37 are connected to thermal vias 39 as shown in FIG. 6 for promotion of heat dissipation.

The grounding patterns 37 are connected, for example, to a printed wiring board of the mobile terminal.

Since the LGA grounding patterns 37 provided in the center area of the lower surface of the lowermost layer of the low-temperature sintered multi-layer board are connected to the thermal vias 39, heat generated by the amplification circuit MMIC10, MMIC20 is conducted through the thermal vias 39 and the LGA grounding patterns 37 and released to the printed wiring board. Therefore, the reduction in the output levels and power application efficiencies of the amplifiers AMP10, AMP20 can be prevented which may otherwise occur due to the heat.

Instead of the LGA grounding patterns 37, a single grounding pattern 37 having a greater size may be provided in the center area of the lower surface of the lowermost dielectric layer of the low-temperature sintered multi-layer board in non-contact relation with respect to the signal terminal patterns and the bias supply terminal patterns provided in the peripheral area of the lower surface of the lowermost layer for the external connection. Where the grounding pattern 37 has a greater size, solder printing for the connection to the printed wiring board tends to be uneven, resulting in an imperfect connection between the grounding pattern 37 and the printed wiring board. Therefore, the grounding pattern 37 provided in the center area of the lower surface of the lowermost layer is coated with an overcoat glass 41 so that at least one portion of the grounding pattern is exposed from the overcoat glass. The overcoat glass 41 is hatched in FIG. 4(i).

As shown in FIG. 6, a grounding pattern 45 for mounting the amplification circuit MMIC10, MMIC20 is provided on the bottom of the two-stage cavity 25 formed by removing a surface portion of the laminate board having the plurality of dielectric layers. The plurality of thermal vias 39 extend from the lower surface of the grounding pattern 45 to the back surface of the laminate board. This arrangement promotes the dissipation of the heat generated during the operation of the amplification circuit MMIC10, MMIC20, thereby preventing the reduction in the output level and power application efficiency of the amplifier AMP10, AMP20 which may otherwise occur due to the heat. The thermal vias 39 for the promotion of the heat dissipation are provided beneath transistor fingers of the amplification circuits MMIC10, MMIC20 which are most likely to generate heat in the amplification circuits MMIC10, MMIC20, and have an area equal to or greater than the area of the transistor fingers.

The thermal vias 39 may be composed of a conductor such as silver or copper having a lower resistance at high temperatures for prevention of the reduction in the output level and power application efficiency of the amplifier AMP10, AMP20 due to the heat.

If the driving voltages of the amplification circuits MMIC10, MMIC20 of the high frequency module are reduced, the output levels and power application efficiencies of the amplifiers AMP10, AMP20 are reduced. Therefore, a lower resistance conductive material such as silver or copper is preferably employed as a material for the distributed constant lines, capacitor conductive patterns and via-hole conductors of the matching circuits MAT10, MAT20. Thus, the reduction in the driving voltages of the amplifiers AMP10, AMP20 can be minimized.

The amplification circuit MMIC10, MMIC20 is fixed to the bottom of the cavity 25 with the use of a conductive paste 47 such as of Ag or AuSn, and the signal patterns and grounding patterns of the amplification circuit MMIC10 and/or MMIC20 are electrically connected to the signal patterns and the grounding patterns provided on the surface of the board by fine wires such as of Au. Thus, reduction in the plan area and thickness of the module and the cost reduction can be realized.

The cavities 25 formed in the multi-layer board are filled with a resin 51 such as an epoxy resin. Thus, the amplification circuits MMIC10 or MMIC20 can firmly be fixed within the cavities 25, and protected from foreign matter.

Figure 7:
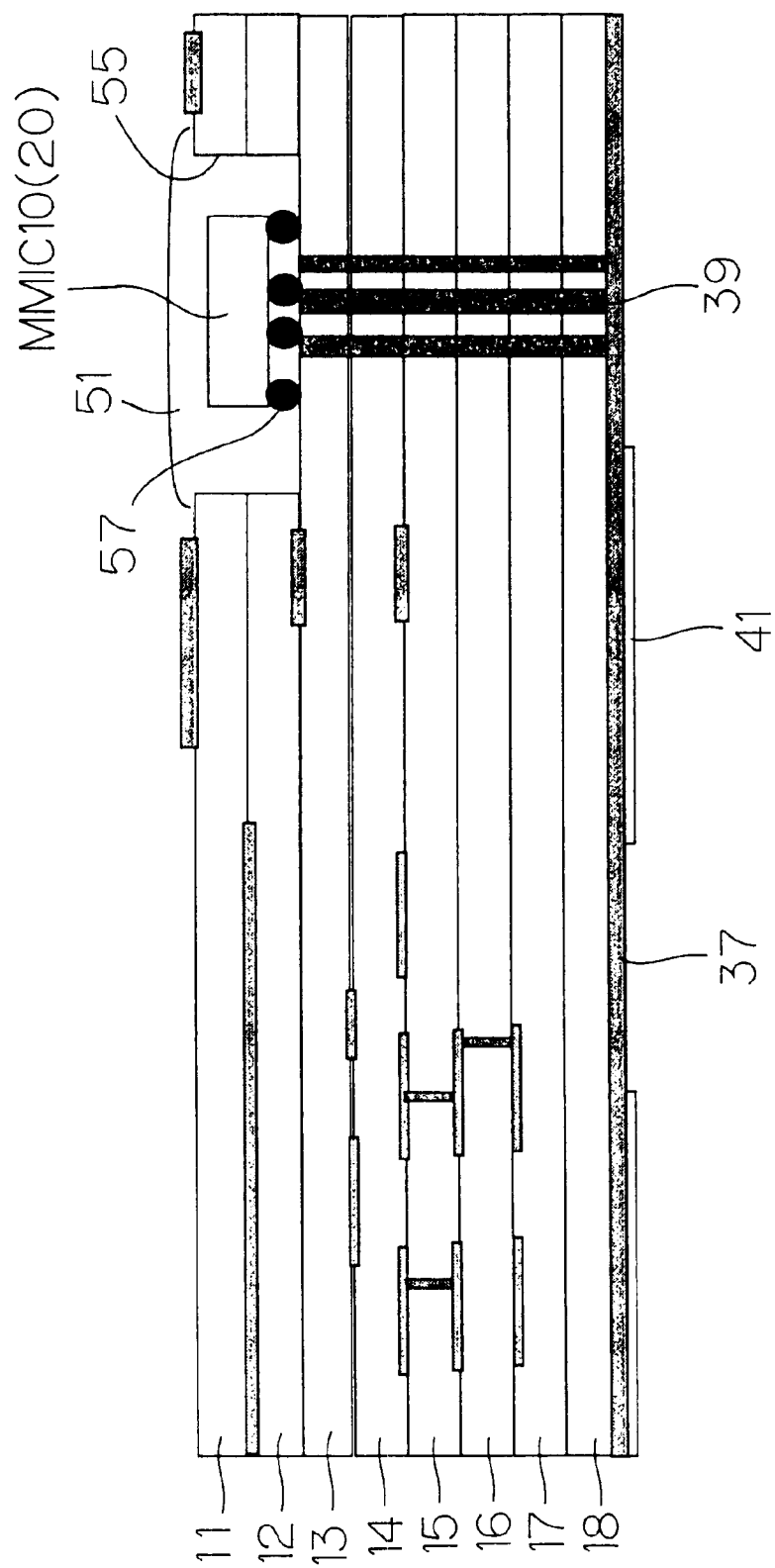
FIG. 7 is a sectional view illustrating an amplification circuit mounted with the use of bumps.

As shown in FIG. 7, the amplification circuit MMIC10, MMIC20 may be mounted within a cavity 55 formed in the surface of the ceramic laminate board with the intervention of gold or aluminum bumps 57 by a flip chip bonding method. The mounting of the amplification circuits MMIC10, MMIC20 by the flip chip bonding method allows for further reduction in the plan area and thickness of the module and further cost reduction.

A relationship between the dielectric constant of the low-temperature sintered laminate board and the wavelength of a signal is generally represented by an expression $\lambda g = v_0 / \{(\epsilon r \times \mu r)^{1/2} f_0\}$. Where, $\lambda$ g is wavelength of an electromagnetic wave, $v_0$ is transmission speed of the electromagnetic wave in the air, $\epsilon$ r is relative dielectric constant, $\mu$ r is relative permeability, and $f_0$ is frequency of the electromagnetic wave. The low-temperature sintered laminate board of the high frequency module is composed of a dielectric material having a dielectric constant of 15 to 25, particularly 18 to 20, which is higher than the dielectric constant (5 to 7) of a dielectric material typically employed for this type of high frequency modules. A known material to be employed as the dielectric material comprises $MgTiO_3$—$CaTiO_3$ as a main component, and $B_2O_3$ and $Li_2CO_3$ as additives. Thus, the lengths of the distributed constant lines of the respective circuits are generally reduced by about 57%, so that the size of the entire module can advantageously be reduced.

The dielectric material for the low-temperature sintered laminate board has a high Q-value (higher than 1,000 as measured at a frequency of 2 GHz), so that a dielectric loss can be reduced. Further, the dielectric material having a high dielectric constant on the order of 15 to 25 provides a wavelength reducing effect. This also makes it possible to reduce losses in the respective filters of the high frequency transmission module. Thus, the output level and efficiency of the high frequency transmission module can be increased.

FIG. 8(a) illustrates a switch circuit, and FIG. 8(b) shows low pass filter characteristics of the switch circuit for a comparison between a case where the switch circuit is produced by employing a high Q-value dielectric material having a dielectric constant of 18.7 and a Q-value of 2,000 as measured at a frequency of 2 GHz and a case where the switch circuit is produced by employing a dielectric material having a dielectric constant of 6.1 and a Q-value of 500 as measured at a frequency of 2 GHz. The lengths of distributed constant lines SL1 and SL2 shown in FIG. 8(a) are 6.68 mm and 9.1 mm, respectively, where the dielectric constant is 18.7, and are 11.53 mm and 16 mm, respectively, where the dielectric constant is 6.1. A loss in the distributed constant line SL2 of the switch circuit is 0.034 dB on the transmitter side and 0.078 dB on the receiver side where the dielectric constant is 18.7, and is 0.074 dB on the transmitter side and 0.183 dB on the receiver side where the dielectric constant is 6.1.

The loss in the entire switch circuit is 0.254 dB on the transmitter side and 0.112 dB on the receiver side where the dielectric constant is 18.7, and is 0.484 dB on the transmitter side and 0.257 dB on the receiver side where the dielectric constant is 6.1.

Thus, the switch circuit produced by employing the dielectric material having a high dielectric constant and a high Q-value contributes to reduction in size and loss.

In the aforesaid embodiment, the distributed constant lines STLD2 and STLG2 are disposed parallel to the coupling lines STLD20 and STLG20, respectively, for coupling along line edges. Alternatively, the main distributed constant lines STLD2 and STLG2 may be provided on an upper dielectric layer, and the coupling lines STLD20 and STLG20 may be provided on a dielectric layer lower by one layer or a predetermined number of layers than the upper layer for the coupling. On the contrary, the main distributed constant lines STLD2 and STLG2 may be provided on a lower dielectric layer, and the coupling lines STLD20 and STLG20 may be provided on a dielectric layer upper by one layer or a predetermined number of layers than the lower layer for the coupling.

Although the laminate board comprises eight dielectric layers as shown in FIG. 3 in the aforesaid embodiment, the number of the dielectric layers is not limited to eight.

In the inventive high frequency module, the branch filter circuit DIP10 for separating the plurality of transceiver systems DCS, GSM having different pass bands from each other, the switch circuits SW10, SW20 for switching the respective transceiver systems DCS, GSM between the transmitter branches TX and the receiver branches RX, the couplers COP10, COP20 provided on the transmitter sides TX of the switch circuits SW10, SW20, and the matching circuits MAT10, MAT20 and the amplification circuits MMIC10, MMIC20 of the amplifiers AMP10, AMP20 are integrated in the single laminate board. Thus, the mounting area on the printed wiring board can be reduced to about one fourth for size reduction as compared with a conventional module where all the components are mounted on the printed wiring board. Even with a reduced size, the leak of signals to the other circuits is prevented which may otherwise occur due to the electromagnetic coupling between the power amplifiers AMP10, AMP20 and the couplers COP10, COP20, because the interference preventing grounding patterns 29 are provided between the power amplifiers AMP10, AMP20, and the couplers COP10, COP20 and the switch circuits SW10, SW20.

Since the high frequency module having the respective components integrated therein is mounted on the printed wiring board, there is no need to form interconnections on the printed wiring board for connection of the respective components. Therefore, the power application efficiency at the antenna terminal can drastically be improved with a suppressed power loss.

Since all the components of the high frequency module can simultaneously be designed, the characteristics of the module can optimally be adjusted. Without the need for the provision of the characteristic adjusting circuits between the respective components, the power loss can be reduced, and the time required for designing the mobile wireless terminal can be reduced for cost reduction.

Since the low-temperature sintered ceramic is employed as the material for the dielectric layers, the plurality of dielectric layers can be sintered together with the distributed constant lines and the capacitor conductive patterns of the capacitors formed on the respective dielectric layers. Therefore, the production process can be simplified for cost reduction.

Figure 9:
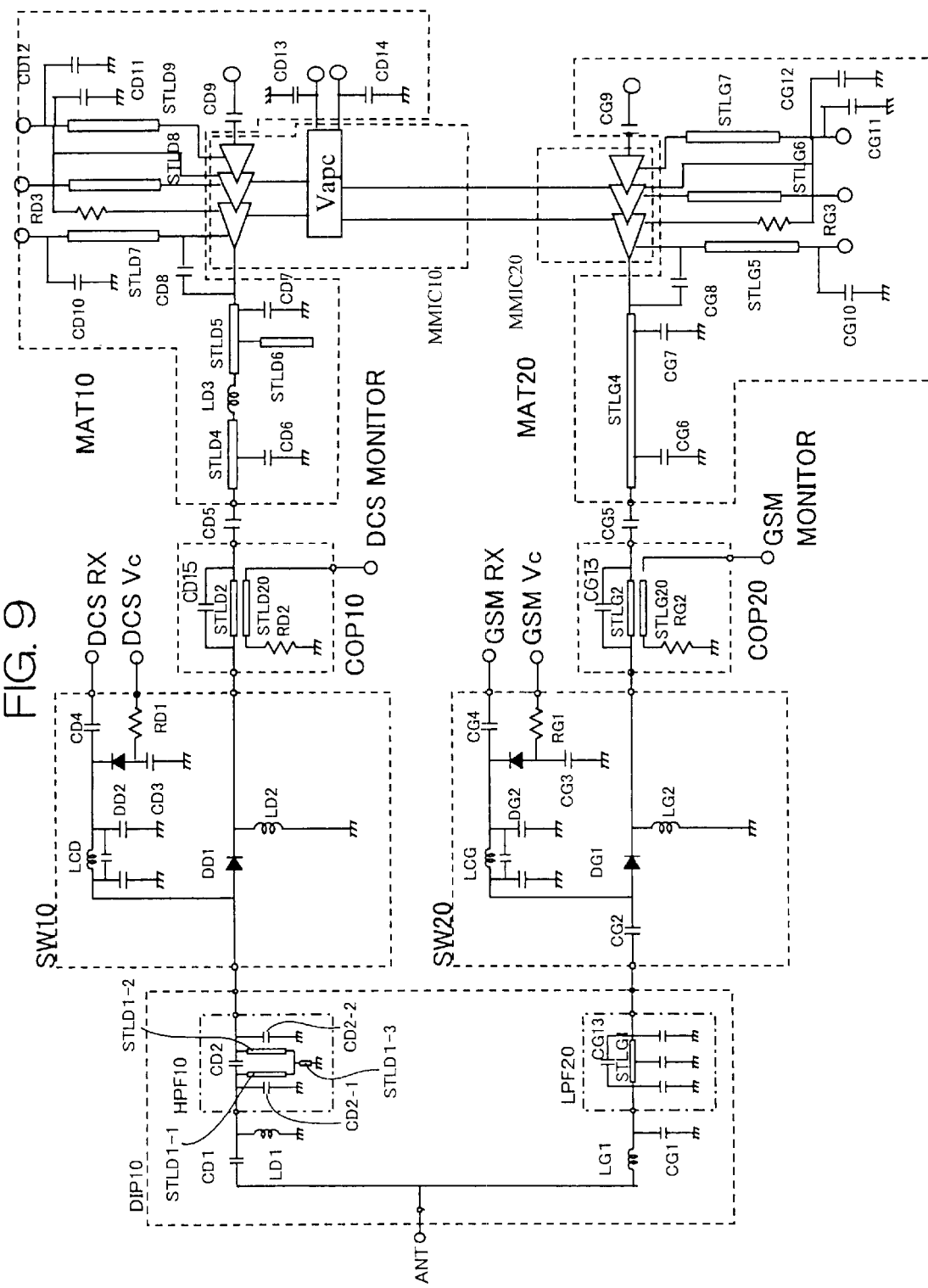
FIG. 9 is a circuit diagram illustrating a high frequency module according to another embodiment of the present invention.
Figure 10:
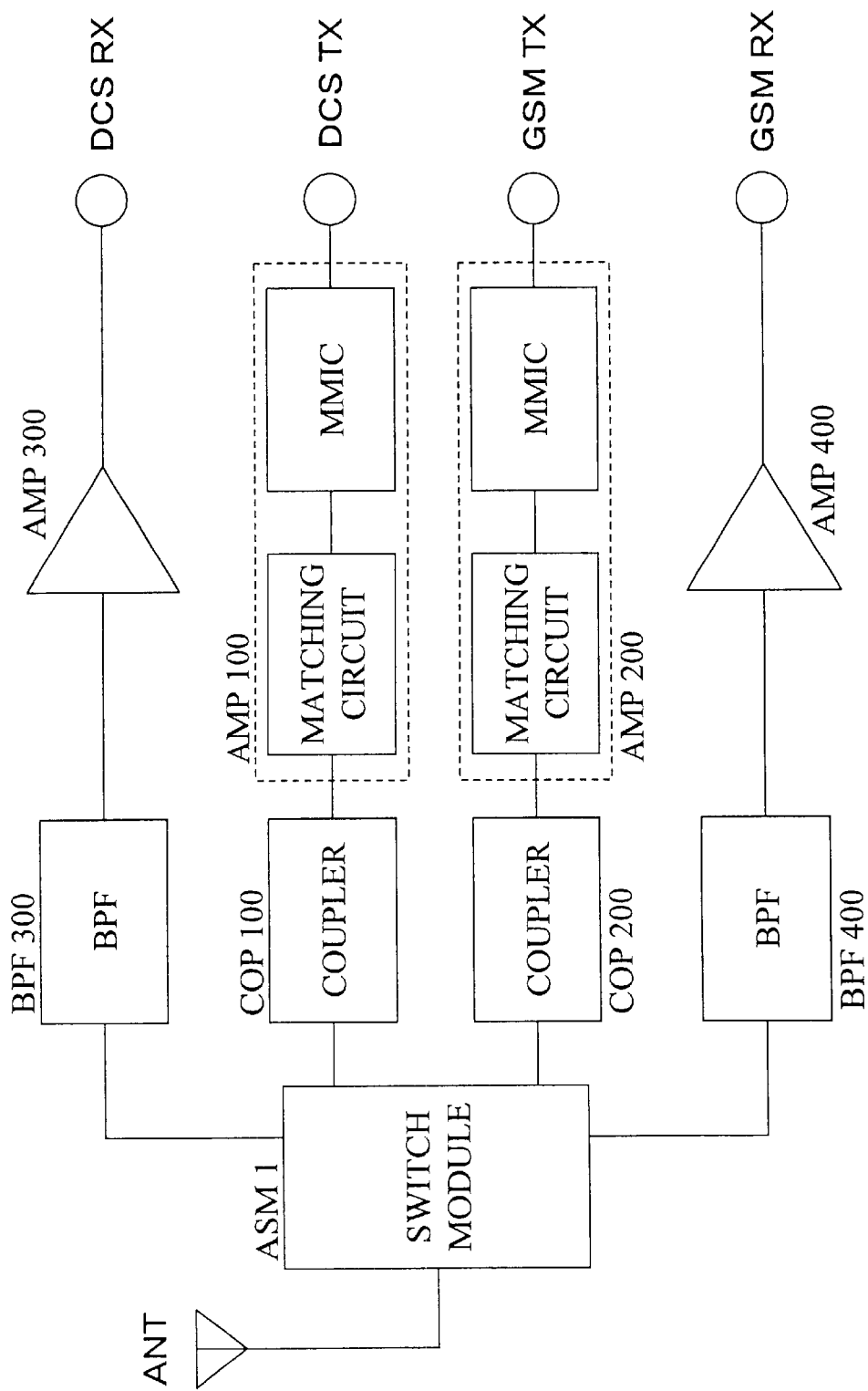
FIG. 10 is a block diagram of a conventional high frequency module.
Figure 11:
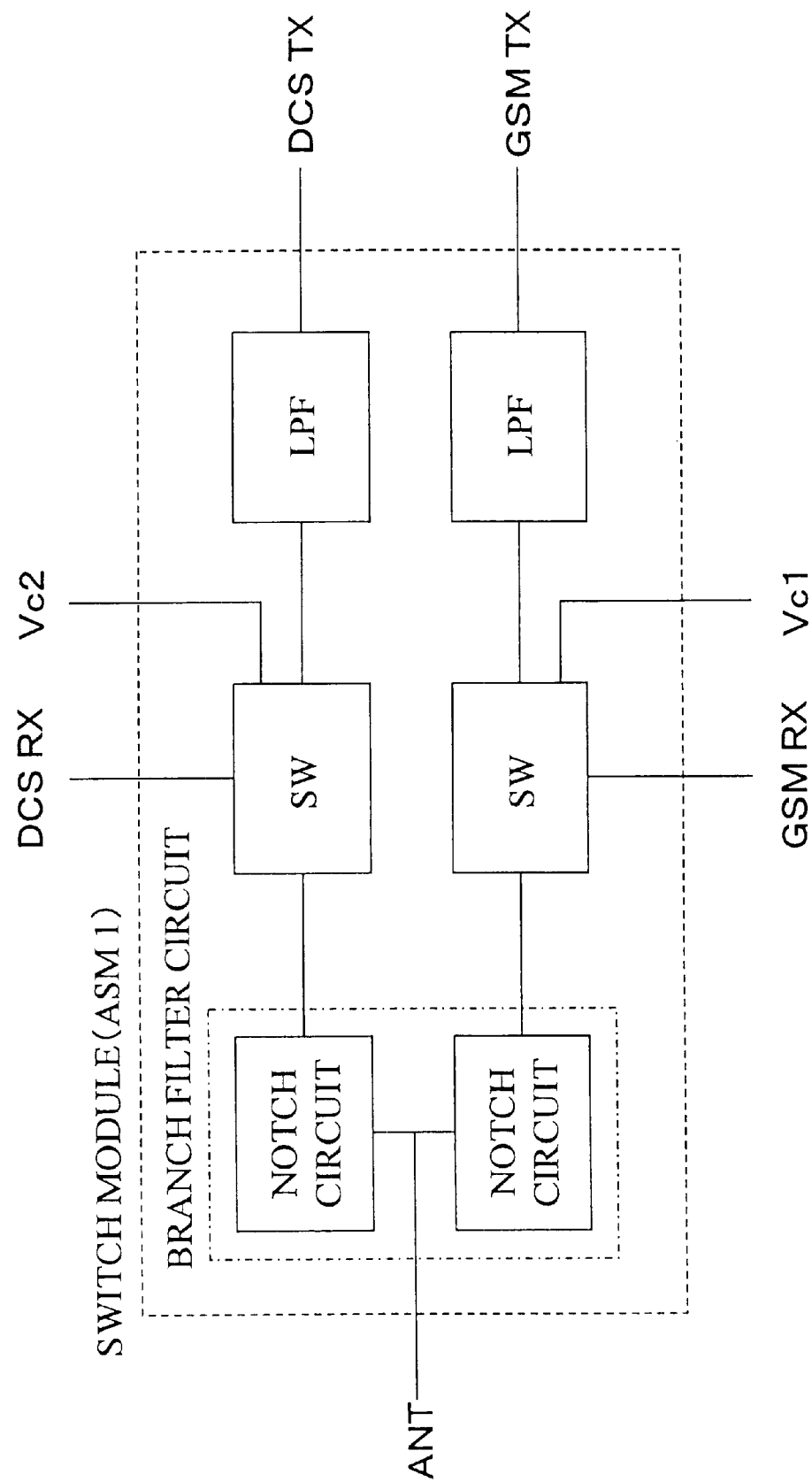
FIG. 11 is a block diagram of a conventional switch module.

FIG. 9 illustrates another embodiment of the present invention. As shown, a branch filter circuit DIP10 for separating a plurality of transceiver systems having different pass bands from each other includes a low pass filter and a high pass filter incorporated in a multi-layer board. That is, the branch filter circuit DIP10 includes a high pass filer HPF10, a capacitor CD1 and an inductor LD1 provided on a DCS side.

The high pass filter HPF10 includes a capacitor CD2 provided in a signal line, distributed constant lines STLD1-1, STLD1-2 provided parallel to each other and connected to opposite ends of the capacitor CD2, a distributed constant line STLD1-3 having a smaller length and connected to a grounding terminal and to a junction between the distributed constant lines STLD1-1 and STLD1-2, and two capacitors CD2-1, CD2-2 connected to grounding terminals and to the opposite ends of the capacitor CD2. The high pass filter HPF10 is incorporated in the laminate board. A DC cut-off capacitor is provided between the high pass filter HPF10 and a diode DD1.

The branch filter circuit DIP10 includes a low pass filter LPF20, a capacitor CG1 and an inductor LG1 provided on a GSM side. The low pass filter LPF20 includes a distributed constant line STLG1, a capacitor CG14 disposed parallel to the distributed constant line STLG1, and other capacitors.

In the branch filter circuit DIP10 shown in FIG. 9, the transceiver systems having different pass bands can be separated from each other as in the branch filter circuit DIP10 shown in FIG. 2, and attenuation on the GSM side can be increased. Therefore, the GSM pass band can assuredly be isolated. That is, isolation between the GSM branch and DCS branch in the inventive high frequency module can be improved.

It should be understood that the present invention be not limited to the embodiments described above but various modifications may be made within the scope of the invention defined by the appended claims.

This application claims priority benefits under the treaty of Japanese Patent Applications Serial No. 2001-188331 and No. 2001-188332, both filed with the Japanese Patent Office on Jun. 21, 2001, the disclosure of which is incorporated herein by reference.

What is claimed is:

1. A high frequency module comprising: a laminate board having a plurality of dielectric layers stacked one on another; a branch filter circuit for separating a plurality of transceiver systems having different pass bands from each other; switch circuits connected to the branch filter circuit for switching the respective transceiver systems between transmitter branches and receiver branches; and power amplifiers respectively connected to the switch circuits and each comprising a matching circuit; a high frequency amplification semiconductor device for amplifying a transmission signal having a frequency within a pass band of each of the transmitter branches; and couplers for monitoring outputs of the power amplifiers.

2. A high frequency module as set forth in claim 1, wherein an interference preventing grounding pattern is provided between the power amplifiers and the switch circuits and between the power amplifiers and couplers.

3. A high frequency module as set forth in claim 1, wherein interference preventing grounding patterns are provided on a surface of the laminate board and between the dielectric layers of the laminate board, and connected to each other through via-hole conductors.

4. A high frequency module as set forth in claim 1, wherein the matching circuit comprises distributed constant lines provided around the high frequency amplification semiconductor device on the surface of the laminate board and/or in the laminate board.

5. A high frequency module as set forth in any of claim 1, wherein the matching circuit comprises a distributed constant line provided between the high frequency amplification semiconductor device and the couplers and/or between the high frequency amplification semiconductor device and couplers.

6. A high frequency module as set forth in claim 1, wherein the couplers and the power amplifiers for the respective pass bands are separately disposed as seen from the top of the laminate board.

7. A high frequency module as set forth in claim 1, wherein the power amplifiers, the switch circuits and the branch filter circuit are arranged in this order in the laminate board.

8. A high frequency module as set forth in claim 1, wherein the distributed constant lines of the matching circuit, distributed constant lines of couplers, and distributed constant lines of the switch circuits are disposed in non-overlapped relation to each other as seen from the top of the laminate board.

9. A high frequency module as set forth in claim 1, wherein the branch filter circuit has capacitor conductive patterns and distributed constant lines provided between the dielectric layers, wherein the switch circuits each have a concentrated constant device provided on the surface of the laminate board, wherein the couplers each have the distributed constant lines provided between the dielectric layers and a concentrated constant device provided on the surface of the laminate board, wherein the power amplifiers each have the high frequency amplification semiconductor device provided in a cavity formed in the surface of the laminate board, distributed constant lines provided between the dielectric layers of the laminate board and on the surface of the laminate board, and a concentrated constant device provided on the surface of the laminate board.

10. A high frequency module as set forth in claim 1, wherein the dielectric layers each have a dielectric constant of 15 to 25.

11. A high frequency module as set forth in claim 1, wherein a signal terminal pattern, a grounding terminal pattern and a bias terminal pattern are provided in a peripheral area of a lower surface of the laminate board, and respectively connected to side-face through-hole electrodes provided on a side face of the laminate board, wherein a grounding pattern is provided in a center area of the lower surface of the laminate board and connected to the grounding terminal pattern, wherein the grounding pattern is coated with an overcoat glass so that plural portions thereof are exposed from the overcoat glass, wherein a thermal via is connected to the grounding pattern.

12. A high frequency module comprising: a laminate board having a plurality of dielectric layers stacked one on another; a branch filter circuit for separating a plurality of transceiver systems having different pass bands from each other; switch circuits connected to the branch filter circuit for switching the respective transceiver systems between transmitter branches and receiver branches; and power amplifiers respectively connected to the switch circuits and each comprising a matching circuit and a high frequency amplification semiconductor device for amplifying a transmission signal having a frequency within a pass band of each of the transmitter branches.

13. A high frequency module as set forth in claim 12, wherein an interference preventing grounding pattern is provided between the power amplifiers and the switch circuits.

14. A high frequency module as set forth in claim 12, wherein interference preventing grounding patterns are provided on a surface of the laminate board and between the dielectric layers of the laminate board, and connected to each other through via-hole conductors.

15. A high frequency module as set forth in claim 12, wherein the matching circuit comprises distributed constant lines provided around the high frequency amplification semiconductor device on the surface of the laminate board and/or in the laminate board.

16. A high frequency module as set forth in claim 12, wherein the matching circuit comprises a distributed constant line provided between the high frequency amplification semiconductor device and the couplers.

17. A high frequency module as set forth in claim 12, wherein the power amplifiers, the switch circuits and the branch filter circuit are arranged in this order in the laminate board.

18. A high frequency module as set forth in claim 12, wherein the distributed constant lines of the matching circuit are disposed in non-overlapped relation with respect to distributed constant lines of the switch circuits as seen from the top of the laminate board.

19. A high frequency module as set forth in claim 12, wherein the branch filter circuit has capacitor conductive patterns and distributed constant lines provided between the dielectric layers, wherein the switch circuits each have a concentrated constant device provided on the surface of the laminate board, wherein the power amplifiers each have the high frequency amplification semiconductor device provided in a cavity formed in the surface of the laminate board, distributed constant lines provided between the dielectric layers of the laminate board and on the surface of the laminate board, and a concentrated constant device provided on the surface of the laminate board.

20. A high frequency module as set forth in claim 12, wherein the dielectric layers each have a dielectric constant of 15 to 25.

21. A high frequency module as set forth in claim 12, wherein a signal terminal pattern, a grounding terminal pattern and a bias terminal pattern are provided in a peripheral area of a lower surface of the laminate board, and respectively connected to side-face through-hole electrodes provided on a side face of the laminate board, wherein a grounding pattern is provided in a center area of the lower surface of the laminate board and connected to the grounding terminal pattern, wherein the grounding pattern is coated with an overcoat glass so that plural portions thereof are exposed from the overcoat glass, wherein a thermal via is connected to the grounding pattern.

* * * * *

UNITED STATES PATENT AND TRADEMARK OFFICE
CERTIFICATE OF CORRECTION

PATENT NO. : 6,683,512 B2
DATED : January 27, 2004
INVENTOR(S) : Nakamata et al.

It is certified that error appears in the above-identified patent and that said Letters Patent is hereby corrected as shown below:

Title page,
Item [73], Assignee, please add -- Mitsubishi Denki Kabushiki Kaisha, Tokyo, Japan --.

Signed and Sealed this

First Day of November, 2005

JON W. DUDAS
*Director of the United States Patent and Trademark Office*